US010366979B2

(12) United States Patent
Reinprecht

(10) Patent No.: US 10,366,979 B2
(45) Date of Patent: Jul. 30, 2019

(54) ELECTROSTATIC DISCHARGE PROTECTION CIRCUIT AND METHOD FOR ELECTROSTATIC DISCHARGE PROTECTION

(71) Applicant: ams AG, Unterpremstaetten (AT)

(72) Inventor: Wolfgang Reinprecht, Tobelbad (AT)

(73) Assignee: ams AG, Unterpremstaetten (AT)

( * ) Notice: Subject to any disclaimer, the term of this patent is extended or adjusted under 35 U.S.C. 154(b) by 402 days.

(21) Appl. No.: 14/902,330

(22) PCT Filed: Jun. 24, 2014

(86) PCT No.: PCT/EP2014/063284
§ 371 (c)(1),
(2) Date: Dec. 30, 2015

(87) PCT Pub. No.: WO2015/000746
PCT Pub. Date: Jan. 8, 2015

(65) Prior Publication Data
US 2016/0372457 A1    Dec. 22, 2016

(30) Foreign Application Priority Data
Jul. 1, 2013    (EP) .................................... 13174533

(51) Int. Cl.
*H02H 9/04*    (2006.01)
*H01L 27/02*    (2006.01)
(52) U.S. Cl.
CPC ......... *H01L 27/0285* (2013.01); *H02H 9/046* (2013.01)

(58) Field of Classification Search
CPC .............................. H01L 27/0285; H02H 9/046
USPC ............................................................ 361/56
See application file for complete search history.

(56) References Cited

U.S. PATENT DOCUMENTS

| 5,465,188 | A | 11/1995 | Pryor et al. |
| 5,483,406 | A | 1/1996 | Bennett et al. |
| 5,508,649 | A | 4/1996 | Shay |
| 6,577,480 | B1 | 6/2003 | Avery et al. |
| 8,847,565 | B2 * | 9/2014 | Vemula ................. G05F 1/613 323/271 |
| 2006/0209479 | A1 | 9/2006 | Grombach et al. |
| 2008/0304191 | A1 | 12/2008 | Riviere et al. |

(Continued)

FOREIGN PATENT DOCUMENTS

DE    102008001368 A1    10/2009
JP         H06503452 A       4/1994
(Continued)

*Primary Examiner* — Kevin J Comber
(74) *Attorney, Agent, or Firm* — Fish & Richardson P.C.

(57) ABSTRACT

An electrostatic discharge protection circuit is proposed comprising a series connection of a pull-up resistor and a trigger device, connecting a first and a second supply terminal. A coupling device is connected between the first and the second supply terminal, and further connected to the series connection so as to generate at an output a compensation voltage depending on a trigger voltage of the trigger device. A discharge device for discharging current from an electrostatic discharge event is connected between the first and second supply terminal and connected to the output of the coupling device, and operating in response to the compensation voltage.

13 Claims, 2 Drawing Sheets

(56) References Cited

U.S. PATENT DOCUMENTS

2009/0268360 A1   10/2009  Shinomiya et al.
2011/0304940 A1   12/2011  Cao et al.
2012/0312881 A1   12/2012  Ochoa et al.

FOREIGN PATENT DOCUMENTS

| JP | 2006261679 A | 9/2006 |
| JP | 2009267072 A | 11/2009 |
| JP | 2009267410 A | 11/2009 |
| TW | 201227909 A | 7/2012 |

\* cited by examiner

ELECTROSTATIC DISCHARGE PROTECTION CIRCUIT AND METHOD FOR ELECTROSTATIC DISCHARGE PROTECTION

The disclosure relates to an electrostatic discharge protection circuit and a method for electrostatic discharge protection.

BACKGROUND OF THE INVENTION

Complementary metal-oxide-semiconductor (CMOS) technology is quickly developing into the sub-micrometer regime and allows for constructing integrated circuits having more and more functional units on an increasingly smaller area. Along with miniaturization progressing to thinner semiconductor structures, like thinner gate oxides, the integrated circuits become prone to damage by electrostatic discharge (ESD), e.g. as oxide breakdown voltages are low. ESD protection devices have to keep pace with the CMOS development and are required to provide trigger voltages which give protection at levels close to the semiconductor's junction breakdown voltages. This is a goal not easy to be reached.

Stacked diodes have been proposed to set the trigger voltage to lower values than the junction breakdown and prevent leakage current. Stacked diodes have a high leakage current and active protection suffers from false triggering in noisy environment. ESD protections circuits with operational voltages of less than 1.8V, however, cannot use a junction breakdown to trigger ESD protection. Either active clamps or stacked diodes are used instead to clamp the ESD voltage.

Diode triggered ESD protections consist of a trigger device, a discharge device and a pull-off circuit to prevent leakage current. The internal resistance of the discharge device often is rather high and results in an increased clamp voltage, which is proportional to the product of ESD current and internal resistance. Increasing the size of the discharge device, however, is area consuming and costly.

SUMMARY OF THE INVENTION

An electrostatic discharge protection circuit comprising a series connection of a pull-up resistor and a trigger device is provided. The series connection connects a first and a second supply terminal. A coupling device is connected between the first and the second supply terminal. Furthermore, the coupling device is connected to the series connection. A discharge device is connected between the first and second supply terminal and further to an output of the coupling device.

In operation the electrostatic discharge protection circuit is connected to an integrated circuit or active circuit via the first and second supply terminals. Under normal operation, i.e. within the allowed supply voltages of the active circuit, the trigger device allows no or only very few current to pass. In case of an electrostatic discharge event a pulse of discharge current is induced into the electrostatic discharge protection circuit and can reach rather high levels. If this discharge current meets or exceeds a certain level, which is determined by the electronic parameters of the devices in the discharge protection circuit, in particular determined by the trigger device, the trigger device opens and current can pass. This leads to a discharge voltage built up and dropping over the pull-up resistor. The discharge voltage is detected by means of the pull-up resistor or, alternatively, by means of the trigger device. A detection voltage measured in this way is a measure of the discharge voltage.

Depending on the detection voltage the coupling device generates a compensation voltage at its output. The discharge device is designed for discharging current from the electrostatic discharge event. In fact, the discharge device operates in response to the compensation voltage. The electrostatic discharge protection circuit compensates the overvoltage of the discharge voltage with respect to a trigger device which is defined by a breakdown voltage of the trigger device, i.e. the minimum voltage that causes trigger device to become electrically conductive.

The compensation voltage is used, in a certain sense, as pre-biasing the discharge device which operates in response to the compensation voltage. By adjusting the compensation voltage the resulting clamp voltage, i.e. the voltage dropping across the discharge device, can be reduced to meet electrostatic discharge protection conditions at a level equal to that of the trigger device. Lower ESD clamp voltage allows for using a design device (to be protected) having a comparably small internal resistance. As a consequence the overall clamp voltage can be reduced and the discharge protection circuit can be produced with small area and at small cost. The overall clamp voltage denotes the minimum voltage that causes the electrostatic discharge protection circuit to successfully discharge the ESD or discharge current. Furthermore, the electrostatic discharge protection circuit has smaller distance of snap back related structures. There is also less stress on the active circuit under typical ESD conditions.

In some implementations, the discharge device operates in response to the compensation voltage such that there is no or only few current flow allowed when there is no compensation voltage applied to the device. And when the compensation voltage reaches a certain level the discharge device opens enough to allow the discharge current induced due to an electrostatic discharge event to be discharged via the device. Alternatively, the discharge or ESD voltage can also be measured using the voltage of the trigger device.

In several implementations, the coupling device comprises an operational amplifier coupled with its input side to the series connection.

The operational amplifier is designed to measure the detection voltage dropping over the pull-up resistor, or alternatively over the trigger device. For example, the operational amplifier can be connected with two inputs between the first supply terminal and a connection node connecting the pull-up resistor with the trigger device. Alternatively, one of the operational amplifiers inputs can be connected to the second supply terminal instead of the first supply terminal. In both cases the operational amplifier detects a voltage, i.e. detection voltage, depending on the discharge voltage from the electrostatic discharge event. The operational amplifier outputs a voltage indicative of the discharge voltage which can be used to define the value of the compensation voltage.

According to some implementations of the electrostatic discharge protection circuit, the operational amplifier is connected as a comparator and further connected to a driver circuit.

The comparator compares the detection voltage to a reference which may be connected to an input of the comparator. Depending on the comparison the comparator outputs a certain voltage level. This voltage is input into the driver circuit where it can be adjusted in level to meet certain conditions. These conditions can be defined with respect to the known trigger voltage of the trigger device such that the resulting compensation voltage allows for compensation of a too high clamp voltage in comparison to the trigger voltage. For example, the compensation voltage can be set to a lower level, such that the resulting clamp voltage is equal to the trigger voltage.

In alternative implementations, the coupling device comprises a converter circuit coupled to the series connection. The converter circuit directly converts the measured discharge voltage, i.e. the detection voltage, into the compensation voltage. Thus, it is designed to generate from the detection voltage as input voltage the compensation voltage. A conversion factor can be adjusted so as to assure that the compensation voltage sets the clamp voltage to a lower level or equal to the trigger voltage. In fact, the conversion can involve an inversion in value so that the compensation voltage is basically subtracted from the clamp voltage.

According to some implementations of the electrostatic discharge protection circuit, the converter comprises a voltage converter adopted to generate the compensation voltage by inverting the detection voltage in value. By inverting the detection voltage the compensation voltage is set to a lower level resulting in a lower clamp voltage or clamp voltage being equal to the trigger voltage.

The implementations with a coupling device comprising an operational amplifier and the implementations with a coupling device comprising a converter circuit are all based on the concept described earlier. Namely, detecting an electrostatic discharge event by means of detecting a voltage drop over the trigger device or the pull-up resistor and discharging the discharge current via the discharge device in response to a compensation voltage. Therein, the compensation voltage is generated utilizing the operational amplifier or the converter circuit, respectively.

According to some implementations of the electrostatic discharge protection circuit, the coupling device is designed to generate the compensation voltage such that a clamp voltage of the discharge device is proportional in value to the trigger voltage. In particular, the compensation voltage is generated such that the clamp voltage of the discharge device is equal in value to the trigger voltage.

In these cases the compensation voltage compensates the voltage drop because of the internal resistance of the discharge device and the overall clamp voltage is limited to the trigger voltage, e.g. the semiconductor breakdown voltage of the trigger device. In turn, this allows for using devices with smaller breakdown voltages and smaller internal resistance.

According to some implementations of the electrostatic discharge protection circuit, the trigger device is a diode, avalanche diode, or Zener diode connected to the pull-up resistor and connected to the second supply terminal. The diode, avalanche diode, or Zener diode only allows current flow in a given direction, i.e. forward direction.

By implementing the diode structure in the way described here only none or small current is flowing during normal operation conditions of the integrated or active circuit connected to the electrostatic protection circuit. Only in the case of an electrostatic discharge event there is enough discharge current induced into the protection circuit to overcome the breakdown voltage of the diode. In this case the discharge voltage drops over the pull-up resistor and gives rise to generation of the compensation voltage and, finally, to discharging the induced current via the discharge device.

The connection of the diode, avalanche diode, or Zener diode to the pull-up resistor can be done with its cathode or anode, respectively. Connecting the cathode to the first supply terminal has the additional advantage that the trigger device can be at a constant voltage during normal operation and false triggering can be avoided.

According to some implementations of the electrostatic discharge protection circuit, the coupling device comprises a current mirror. The current mirror is designed for mirroring the discharge voltage and generating the compensation voltage based on the mirrored trigger voltage.

According to some implementations of the electrostatic discharge protection circuit, the discharge device comprises a transistor, in particular a PMOS-transistor. The compensation voltage, in this case, is used as pre-biasing the control side or gate of the transistor.

According to some implementations of the electrostatic discharge protection circuit, the transistor is a diode-connected transistor and connected to the output of the coupling device via its control side and connected to the first and second supply terminals via its input sides. In case of a PMOS-transistor the control side is the transistor gate which is then pre-biased by the compensation voltage to a lower level.

A method for electrostatic discharge protection comprising detecting an electrostatic discharge event by measuring a detection voltage is provided. In turn, a compensation voltage is generated depending on a trigger voltage of a trigger device. Discharge current induced from the detected electrostatic discharge event is then discharged using a discharge device operating in response to the compensation voltage.

Depending on the detection voltage the coupling device generates a compensation voltage. The measuring of the discharge voltage can be done by using a pull-up resistor or via the trigger device. The discharge device is designed for discharging current from the electrostatic discharge event. In fact, the discharge device operates in response to the compensation voltage. The electrostatic discharge protection circuit compensates the overvoltage with respect to a trigger device which defines the breakdown voltage of the ESD protection, i.e. the minimum voltage that causes trigger device to become electrically conductive.

The compensation voltage is used, in a certain sense, as pre-biasing the discharge device which operates in response to the compensation voltage. By adjusting the compensation voltage the resulting clamp voltage, i.e. the voltage dropping over the discharge device, can be reduced to meet electrostatic discharge protection conditions at a level equal to that of the trigger device. As a consequence the overall clamp voltage can be reduced and a discharge protection circuit can be produced with small area and at small cost. The overall clamp voltage denotes the minimum voltage that causes the electrostatic discharge protection circuit to successfully discharge the ESD or discharge current. Furthermore, the electrostatic discharge protection circuit can have smaller distance of snap back related structures and there is also less stress on the active circuit under typical ESD conditions.

According to some implementations of the method, the compensation voltage is generated so as to lower in value a clamp voltage of the discharge device. Lower ESD clamp voltage allows for using a device with a comparably small internal resistance.

According to some implementations of the method, the compensation voltage is generated so as to set the clamp voltage of the discharge device proportional in value to the trigger voltage. In particular, the compensation voltage is generated so as to set the clamp voltage equal in value to the trigger voltage. This way the ESD clamp voltage can be further reduced down to the trigger voltage, e.g. the breakdown voltage, of the trigger device.

According to some implementations of the method, the compensation voltage is generated by subtracting the detection voltage from the trigger voltage.

According to some implementations of the method, the compensation voltage is used to bias a control side of a transistor, in particular a PMOS-transistor.

According to some implementations of a method for electrostatic discharge protection, the method comprises detecting an electrostatic discharge event by a discharge voltage by means of a detection voltage dropping over a trigger device or a pull-up resistor (PR), wherein the trigger device and the pull-up resistor are connected in series between supply terminals to be protected. The method further comprises, by means of utilizing a converter circuit coupled to the series connection, generating a compensation voltage depending on the detection voltage. The method further comprises discharging current from the detected electrostatic discharge event using a discharge device operating in response to the compensation voltage.

According to some implementations of the method, the compensation voltage is generated so as a clamp voltage of the discharge device is set to be proportional in value to a trigger voltage of the trigger device, in particular to be equal in value to the trigger voltage.

BRIEF DESCRIPTION OF THE DRAWINGS

In the following, the principle presented above will be described in more detail with respect to drawings in which exemplary embodiments are presented.

FIG. 1 shows an exemplary embodiment of an electrostatic discharge protection circuit according to the principle presented. The electrostatic discharge protection circuit, comprises a pull-up resistor PR, a trigger device TD, a coupling dev

DETAILED DESCRIPTION

Figure 1:
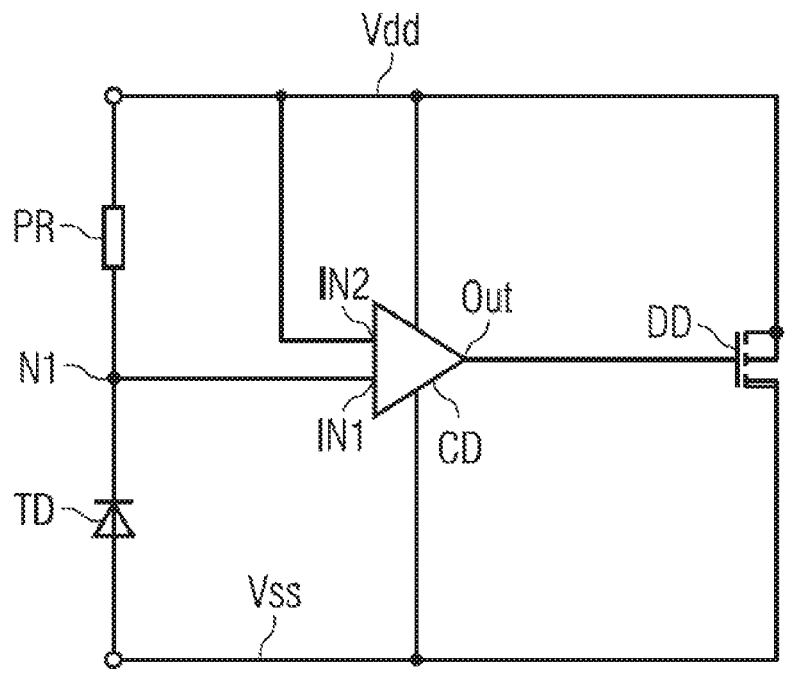
FIG. 1 shows an exemplary embodiment of an electrostatic discharge protection circuit according to the principle presented.

The pull-up resistor PR is connected in series with the trigger device TD which is a trigger diode or Zener trigger diode. The diode or Zener diode is connected to the pull-up resistor PR via its cathode and to the second supply terminal VSS via its anode. The series connection of pull-up resistor R and trigger device TD is connecting a first and a second supply terminal VDD, VSS. The first and a second supply terminal VDD, VSS may for example power rails which can be further connected with integrated circuits.

The coupling device CD is also connected between the first and the second supply terminal VDD, VSS, and further to the series connection via a circuit node N1 between the pull-up resistor PR and trigger device TD. In the present embodiment the coupling device CD comprises a comparator and a driver circuit. The comparator has a first input IN1 connected to the circuit node N1 and a second input IN2 connected to the first supply terminal VDD. The coupling device CD is also connected between the first and second supply terminal VDD, VSS for supply. The discharge device PMOS is connected between the first and second supply terminal VDD, VSS and to an output OUT of the coupling device. For example, the discharge device PMOS is a transistor, in particular a PMOS transistor.

In operation the circuit is connected to an integrated circuit via the first and the second supply terminal VDD, VSS. Under normal conditions there is no or only a small amount of current flowing through the trigger device as the diode, avalanche or Zener diode is connected in reverse direction. In case of an electrostatic discharge event, however, electrostatic current is induced into the electrostatic discharge protection circuit and may reach the trigger devices breakdown voltage and a characteristic voltage drop can be detected over the pull-up resistor PR. This voltage drop, i.e. detection voltage, is detected via the comparator, i.e. via the first and second inputs IN1, IN2.

Depending on the detected voltage-drop across the pull-up resistor PR the coupling device CD generates a compensation voltage Vcomp at the output OUT. The output OUT is connected to a control side of the discharge device. In implementations where the discharge device is realized as a transistor or PMOS transistor, the control side corresponds to the transistor gate. Thus, the transistor or PMOS transistor operates in response to the compensation voltage Vcomp which adjusts a pre-bias at the gate. In fact, the compensation voltage Vcomp defines a clamp voltage Vclamp of the discharge device and allows for discharging the ESD current induced from the electrostatic discharge event.

The electrostatic discharge protection circuit compensates over voltage above the breakdown voltage of the trigger device, i.e. as detected by the voltage-drop over the pull-up resistor, by pre-biasing the control side of the discharge device, e.g. the gate of the transistor, to a lower level. In fact, the resulting clamp voltage Vclamp can be set equal to the trigger voltage as will be explained with respect to FIG. 2. This results in a reduction of the clamp voltage Vclamp under ESD/EOS conditions to a level equal to the trigger element. In turn, the lower clamp voltage Vclamp allows the use of improved discharge and design devices with less internal resistance Ron. For example, this results in smaller distance of snapback related structures and less stress on the active circuit under ESD/EOS/LU conditions.

Figure 2:
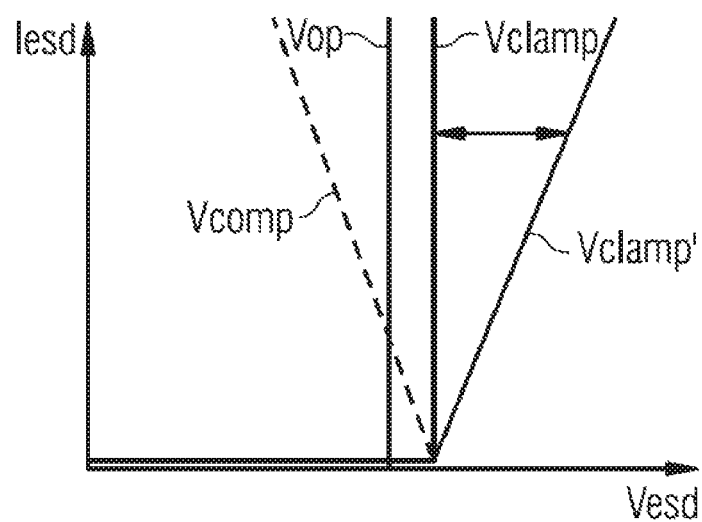
FIG. 2 shows a characteristic voltage over current curve of the exemplary embodiment according to FIG. 1.

FIG. 2 shows a characteristic voltage over current curve of the exemplary embodiment according to FIG. 1. The drawing shows the ESD voltage Vesd as a function of the discharge current Iesd, i.e. the induced current Iesd generates a discharge voltage Vesd drop across the ESD device. Several characteristic graphs are depicted. The line referenced Vop corresponds to the maximum supply voltage of an active circuit to be protected. The curve referenced Clamp' shows the clamp voltage in an integrated solution with no compensation voltage applied. The dashed graph Vcomp shows the compensation voltage through biasing of the transistor gate via output OUT provided by the comparator and driver circuit. The graph Vclamp shows the response of the compensated ESD clamp circuit with low driven Gate voltage and compensated ESD clamp voltage. The benefit is the voltage difference indicated by the arrow. There is lower clamp voltage at high current which would otherwise require active devices be exposed to higher voltages than maximum supply voltage Vop.

As discussed above this embodiment uses a comparator to measure the detection voltage between over the pull-up resistor and uses a driver circuit to bias the gate of the discharge device in such a way that the ESD clamp voltage Vclamp is lower. In fact, the comparator and driver circuit can be set such that clamp voltage Vclamp is equal to the trigger voltage Vtrigg. This is achieved by adjusting the clamp voltage Vclamp by the compensation voltage Vcomp. This way the clamp voltage Vclamp can be set with respect to maximum supply voltage Vop to ensure latch up free operation.

The ESD Design Window is given by the maximum supply voltage Vop as the lower limit and the minimum breakdown voltage Vbd of any active device to be protected. There is no need to implement large big FETs to keep the internal resistance of the discharge device low or requires active devices with high breakdown voltage. The electrostatic discharge protection circuit reduces the delta between the trigger voltage Vtrig and the clamp voltage Vclamp to a minimum, only limited by the accuracy of the comparator circuit.

Figure 3:
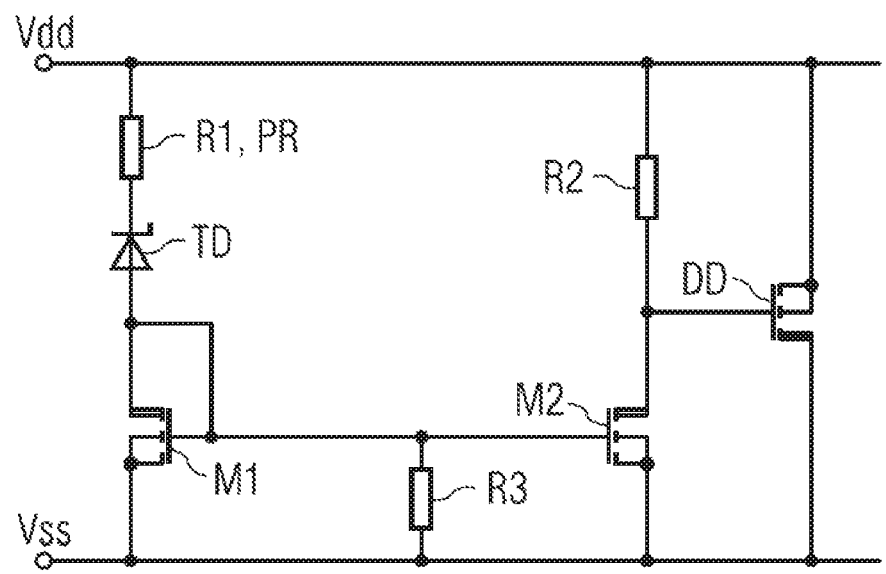
FIG. 3 shows another exemplary embodiment of an electrostatic discharge protection circuit according to the principle presented.

FIG. 3 shows another exemplary embodiment of an electrostatic discharge protection circuit according to the principle presented. The series connection comprises the pull-up resistor PR, referenced as R1, and the trigger device TD, which is a Zener diode in this particular case. As mentioned above a diode or avalanche diode can be used as well. The series connection is further connected to a first transistor M1 which is of NMOS type and diode-connected to the second supply terminal VSS. The pull-up resistor PR, R1 connects the series connection with the first supply terminal.

The first transistor M1 forms part of a current-mirror which further comprising a second transistor M2, which is a NMOS diode-connected transistor as well. First and second transistors M1, M2 form the current-mirror via their respective gate connections and connection to the trigger device TD. Between transistors M1, M2 a third resistor R3 connects the current mirror to the second supply terminal VSS. Here third resistor R3 is a pull-down resistor. Additionally, the second transistor M2 is connected in series with a second resistor R2 connecting the first and second supply terminal VDD, VSS. Between second resistor R2 and second transistor M2 the gate of the discharge device DD is connected. In this particular case, the discharge device DD is a diode-connected PMOS transistor. Source and drain of the discharge device DD are connected to the first and second supply terminal VDD, VSS.

Furthermore, pull-up resistor R1, PR and second resistor R2 may be matched such that their resistance values R1, R2 are given as 2·R1=R2. This way the current through the second resistor R2 is set to be twice the current through the pull-up resistor R1, PR.

Under operation, and when an electrostatic discharge event has occurred that is strong enough to allow current to flow in the forward direction of the trigger device a corresponding discharge voltage Vesd builds up over the pull-up resistor R1, PR. Resistor R1 reduces leakage current. The compensation voltage Vcomp is adjusted in value and sign by means of the current flowing through the first transistor M1 mirrored to the second transistor M2 and second resistor R2 and drops across resistor R3. This way it is applied to the gate of the PMOS transistor. As a result the clamp voltage Vclamp over the discharge device DD is lowered to be close or equal to the trigger voltage Vtrigg. Thus the overall clamp voltage of the circuit is determined by the trigger voltage Vtrigg of the trigger device TD, i.e. the breakdown voltage of the diode.

Figure 4:
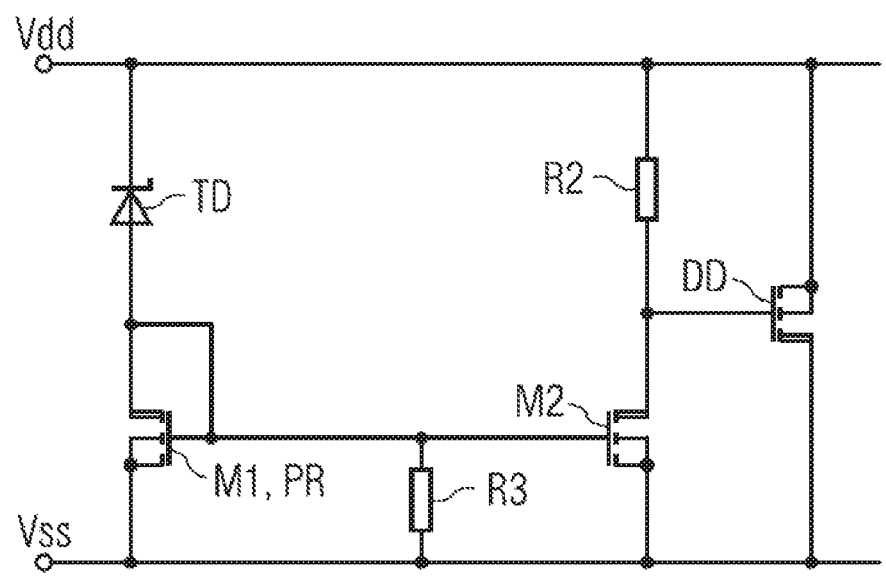
FIG. 4 shows another exemplary embodiment of an electrostatic discharge protection circuit according to the principle presented.

FIG. 4 shows another exemplary embodiment of an electrostatic discharge protection circuit according to the principle presented. This embodiment is based on the one of FIG. 3 and constitutes a further development of the latter. The resistor R1 is omitted to reduce effect of potential false triggering. In particular, the cathode of the trigger device, i.e. the diode, is directly connected to the first supply terminal VDD. This way the cathode is on constant potential during normal operation as there is no voltage drop over resistor R1. The role of the pull-up resistor PR is taken over by the resistance of the first transistor M1 instead.

The invention claimed is:

1. An electrostatic discharge protection circuit, comprising:
   a series connection of a pull-up resistor and a trigger device, connecting a first and a second supply terminal;
   a coupling device
      comprising an operational amplifier coupled with its input side to the series connection,
      being connected between the first and the second supply terminal, and
      further being connected to the series connection so as to generate at an output a compensation voltage depending on a discharge voltage; and
   a discharge device for discharging current from an electrostatic discharge event, connected between the first and second supply terminal and connected to the output of the coupling device, and operating in response to the compensation voltage,
   wherein the operational amplifier is connected as a comparator having a first input and a second input, and further connected to a driver circuit operable to generate the compensation voltage, and
   wherein the coupling device is operable to:
      measure, using the operational amplifier, a detection voltage across the first input and the second input, the detection voltage corresponding to a voltage drop over the trigger device or the pull-up resistor, and
      generate and adjust, using the driver circuit, the compensation voltage based on the measured detection voltage, such that a clamp voltage across the discharge device is equal to or lower than a trigger voltage of the trigger device.

2. The electrostatic discharge protection circuit according to claim 1, wherein the operational amplifier is coupled with the first input to a circuit node between the pull-up resistor and the trigger device and coupled with the second input to the first supply terminal or to the second supply terminal.

3. The electrostatic discharge protection circuit according to claim 1, wherein the trigger device comprises a diode or a Zener diode connected to the pull-up resistor and to the second supply terminal.

4. The electrostatic discharge protection circuit according to claim 3, wherein the diode or the Zener diode comprises:
   an anode, and
   a cathode electrically coupled between the anode and the pull-up resistor.

5. The electrostatic discharge protection circuit according to claim 1, wherein the discharge device comprises a PMOS transistor.

6. The electrostatic discharge protection circuit according to claim 5, wherein the transistor is diode-connected and further connected to the output of the coupling device via its control side and connected to the first and second supply terminal (VDD, VSS) via its input sides.

7. The electrostatic discharge protection circuit according to claim 1, wherein the operational amplifier is operable to output a voltage indicative of a discharge voltage for defining a value of the compensation voltage.

8. The electrostatic discharge protection circuit according to claim 1, wherein the coupling device is operable to generate and adjust the compensation voltage so as to lower in value the clamp voltage across the discharge device.

9. A method for electrostatic discharge protection comprising the steps of:
- detecting an electrostatic discharge event by a discharge voltage by means of a detection voltage dropping over a trigger device or a pull-up resistor, wherein the trigger device and the pull-up resistor are connected in series between supply terminals to be protected;
- by means of utilizing an operational amplifier coupled with its input side to the series connection, measuring the detection voltage as a voltage drop across a first input and a second input of the operational amplifier, and generating and adjusting a compensation voltage depending on the detection voltage; and
- discharging current from the detected electrostatic discharge event using a discharge device operating in response to the compensation voltage,
- wherein the operational amplifier is connected as a comparator and further connected to a driver circuit, and wherein the compensation voltage is generated and adjusted such that a clamp voltage across the discharge device is equal to or lower than a trigger voltage of the trigger device.

10. The method according to claim 9, wherein the operational amplifier is coupled to a circuit node between the pull-up resistor and the trigger device and coupled to one of the supply terminals.

11. The method for electrostatic discharge protection according to claim 9, wherein the compensation voltage is generated so as to lower in value the clamp voltage across the discharge device and to reduce a difference between the clamp voltage across the discharge device and a trigger voltage of the trigger device to a minimum.

12. The method for electrostatic discharge protection according to claim 9, wherein the compensation voltage is generated by subtracting from the trigger voltage the detection voltage.

13. The method for electrostatic discharge protection according to claim 9, wherein the compensation voltage is used to bias a gate of a PMOS transistor.

* * * * *